(12) United States Patent
Hu et al.

(10) Patent No.: US 8,320,646 B2
(45) Date of Patent: Nov. 27, 2012

(54) MRI ACQUISITION USING 2D SENSE AND PARTIAL FOURIER PACE SAMPLING

(75) Inventors: Houchun H. Hu, Cerritos, CA (US); Ananth J. Madhuranthakam, Jamaica Plain, MA (US); Stephen J. Riederer, Rochester, MN (US)

(73) Assignee: MAYO Foundation for Medical Education and Research, Rochester, MN (US)

( * ) Notice: Subject to any disclaimer, the term of this patent is extended or adjusted under 35 U.S.C. 154(b) by 1139 days.

(21) Appl. No.: 11/913,429

(22) PCT Filed: May 2, 2006

(86) PCT No.: PCT/US2006/016584
§ 371 (c)(1),
(2), (4) Date: Nov. 2, 2007

(87) PCT Pub. No.: WO2006/119164
PCT Pub. Date: Nov. 9, 2006

(65) Prior Publication Data
US 2008/0187196 A1    Aug. 7, 2008

Related U.S. Application Data

(60) Provisional application No. 60/677,658, filed on May 4, 2005.

(51) Int. Cl.
*G06K 9/00* (2006.01)
(52) U.S. Cl. .................. 382/128; 324/309; 600/410
(58) Field of Classification Search .................. 382/128
See application file for complete search history.

(56) References Cited

U.S. PATENT DOCUMENTS

| | | | |
|---|---|---|---|
| 5,084,675 A | 1/1992 | Reinfelder et al. | |
| 6,144,874 A | 11/2000 | Du | |
| 6,242,916 B1 * | 6/2001 | King | 324/309 |
| 6,411,089 B1 * | 6/2002 | Anand et al. | 324/309 |
| 6,518,759 B2 * | 2/2003 | Bernstein | 324/307 |
| 6,671,536 B2 * | 12/2003 | Mistretta | 600/410 |
| 7,610,076 B2 * | 10/2009 | Riederer et al. | 600/415 |
| 2004/0049106 A1 | 3/2004 | Kanazawa | |

OTHER PUBLICATIONS

International Search Report and Written Opinion corresponding to PCT/US2006/016584 under date of mailing of May 8, 2007.

* cited by examiner

*Primary Examiner* — Philip A Johnston
(74) *Attorney, Agent, or Firm* — Quarles & Brady, LLP

(57) ABSTRACT

An MRI system produces a three-dimensional image by acquiring NMR signals that fully sample a central region of k-space and partially sample peripheral k-space as a set of asymmetric radial sectors. The NMR signals are acquired with a plurality of receive channels and coils. An image is reconstructed using a homodyne reconstruction combined with SENSE processing.

13 Claims, 6 Drawing Sheets

MRI ACQUISITION USING 2D SENSE AND PARTIAL FOURIER PACE SAMPLING

CROSS-REFERENCE TO RELATED APPLICATIONS

This application is based on U.S. Provisional Patent Application Ser. No. 60/677,658 filed on May 4, 2005, and entitled "MRI ACQUISITION USING 2D SENSE AND PARTIAL FOURIER SPACE SAMPLING."

STATEMENT REGARDING FEDERALLY SPONSORED RESEARCH

This invention was made with government support under Grant No. EB000212 awarded by the National Institute of Biomedical Imaging and Bioengineering. The United States Government has certain rights in this invention.

BACKGROUND OF THE INVENTION

The field of the invention is nuclear magnetic resonance imaging (MRI) methods and systems. More particularly, the invention relates to magnetic resonance angiography (MRA).

When a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, Mz, may be rotated, or "tipped", into the x-y plane to produce a net transverse magnetic moment Mt. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The present invention will be described in detail with reference to a variant of the well known Fourier transform (FT) imaging technique, which is frequently referred to as "spin-warp". The spin-warp technique is discussed in an article entitled "Spin-Warp NMR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of NMR echo signals to phase encode spatial information in the direction of this gradient. In a two-dimensional implementation (2DFT), for example, spatial information is encoded in one direction by applying a phase encoding gradient (Gy) along that direction, and then an echo signal is acquired in the presence of a readout magnetic field gradient ($G_x$) in a direction orthogonal to the phase encoding direction. The readout gradient present during the acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed. In a typical 3DFT pulse sequence spatial information is encoded along two orthogonal axes and the phase encodings ($\Delta G_y$ and $\Delta G_z$) are both stepped through values to sample Fourier space, or "k-space" in a prescribed manner.

MR angiography (MRA) is the application of magnetic resonance imaging methods to the depiction of the human vasculature. To enhance the diagnostic capability of MRA a contrast agent such as gadolinium can be injected into the patient prior to the MRA scan. Excellent diagnostic images may be acquired using contrast-enhanced MRA if the data acquisition is properly timed with the bolus passage.

The non-invasiveness of MRA makes it a valuable screening tool for cardiovascular diseases. Screening typically requires imaging vessels in a large volume. This is particularly true for diseases in the runoff vessels of the lower extremity. The field of view (FOV) in MR imaging is limited by the volume of the $B_0$ field homogeneity and the receiver coil size (typically, the FOV<48 cm on current commercial MR scanners). The anatomic region of interest in the lower extremity, for example, is about 100 cm and this requires several FOVs, or stations, for a complete study. This requires that the patient be repositioned inside the bore of the magnet, the patient be re-landmarked, scout images be acquired and a preparation scan be performed for each FOV. All of these additional steps take time and, therefore, are expensive. When contrast enhanced MRA is performed, the repositioning also necessitates additional contrast injections.

Recently gadolinium-enhanced bolus chase techniques have been reported which overcome this difficulty, K. Y. Ho, T. Leiner, M. H. de Hann, J. M. A. van Engleshoven, "Gadolinium optimized tracking technique: a new MRA technique for imaging the peripheral vascular tree from aorta to the foot using one bolus of gadolinium (abs)." *Proc. 5th Meeting of ISMRM*, p203, 1997. As described in U.S. Pat. Nos. 5,924,987 and 5,928,148, MRA data is acquired from a large field of view by automatically moving the patient table to a plurality of different locations during the scan and acquiring an image at each station. If data is acquired quickly, the movement of the table may be timed to follow the contrast bolus through the vasculature so that peak contrast is achieved at each station.

As described in U.S. Pat. No. 6,912,415, filed on Nov. 26, 2001 and entitled "Method For Acquiring MRI Data From A Large Field Of View Using Continuous Table Motion", MRA images over an extended field of view can be acquired while continuously moving the patient table through the scanner. This speeds up the scan and enables 3D image data to be acquired, but even shorter scan times are needed in order to track the contrast bolus through the vasculature and acquire high resolution images.

One method for reducing scan time is to reduce the number of phase encoding views that are acquired to sample k-space. One such method is to partially acquire k-space and then calculate the missing data. Such "partial" Fourier data acquisition usually uses Hermitian conjugate symmetry to replace the missing k-space data. Hermitian conjugate symmetry only works if the image is real. Numerous phase errors are present in MRI data that make the image complex. These phase errors result from phenomena such as $B_0$ inhomogeneity, gradient eddy currents, group delays in the gradient amplifiers and receive electronics, and the spatial variation of surface coil receive $B_1$ fields. To enable Hermitian conjugate replacement to work with a complex image, the replacement of the missing k-space data is accompanied by a phase correction which removes the phase errors from this data. One partial Fourier reconstruction algorithm, called "Homodyne reconstruction", uses two filters to accomplish the Hermitian conjugate replacement and the phase correction, respectively.

A Homodyne high pass filter doubles the amplitude of the acquired k-space data which is conjugate to the missing k-space data prior to the Fourier transform. After the Fourier transform, the imaginary part of the image is discarded to complete the replacement step. The phase correction step is accomplished by a Homodyne low pass filter. This filter creates an image from a small portion of k-space data acquired symmetrically around the center of k-space. The phase of this image is subtracted from the phase of the Homodyne high pass filtered image prior to discarding the imaginary part of the image.

Another technique that is used to shorten scan time is referred to generally as a "parallel imaging technique". Such "pMRI" techniques use spatial information from arrays of RF detector coils to substitute for the phase encoding which would otherwise have to be obtained in a sequential fashion using field gradients and RF pulses. The use of multiple effective detectors has been shown to multiply imaging speed, without increasing gradient switching rates or RF power deposition. For Fourier pulse sequences that sample a rectilinear trajectory in k-space, parallel imaging techniques invariably reduce the number of phase encoding steps needed to sample k-space and thereby reduce imaging time. The coil sensitivity information is used during the image reconstruction to make up for the loss of spatial information.

Parallel imaging techniques fall into one of two categories. They can fill in the omitted k-space lines prior to Fourier transformation, by constructing a weighted combination of neighboring lines acquired by the different RF detector coils. Or, they can first Fourier transform the undersampled k-space data set to produce an aliased image from each coil, and then unfold the aliased signals by a linear transformation of the superimposed pixel values.

Two such parallel imaging techniques that have recently been developed and applied to in vivo imaging are SENSE (SENSitivity Encoding) and SMASH (simultaneous acquisition of spatial harmonics). Both techniques include the parallel use of a plurality of separate receiving coils, with each coil having a different sensitivity profile. The combination of the separate NMR signals produced by these coils enables a reduction of the acquisition time required for an image (in comparison with conventional Fourier image reconstruction) by a factor which in the most favorable case equals the number of the receiving coils used as explained by Pruessmann et al. in Magnetic Resonance in Medicine Vol. 42, p. 952-962, 1999.

SUMMARY OF THE INVENTION

The present invention is a method for acquiring three-dimensional MR image data and for reconstructing a three-dimensional image therefrom. More particularly, image data is acquired with a plurality of receive channels using a three-dimensional pulse sequence in which two orthogonal phase encoding gradients are stepped through sets of values to sample three-dimensional k-space in a prescribed pattern. The prescribed pattern includes a central region that is sampled in a centric view order and a peripheral region that is undersampled as a set of radial sectors. An image is reconstructed using a homodyne and a 2D SENSE reconstruction method.

A general object of the invention is to reduce the amount of data that needs to be acquired for a 3D MR image so that total scan time can be reduced. This is achieved in part by performing a SENSE acquisition and image reconstruction that enables all of k-space to be undersampled, and in part by a homodyne reconstruction that enables undersampling of the peripheral region of k-space as a set of radial sectors.

DESCRIPTION OF THE PREFERRED EMBODIMENT

Figure 1:
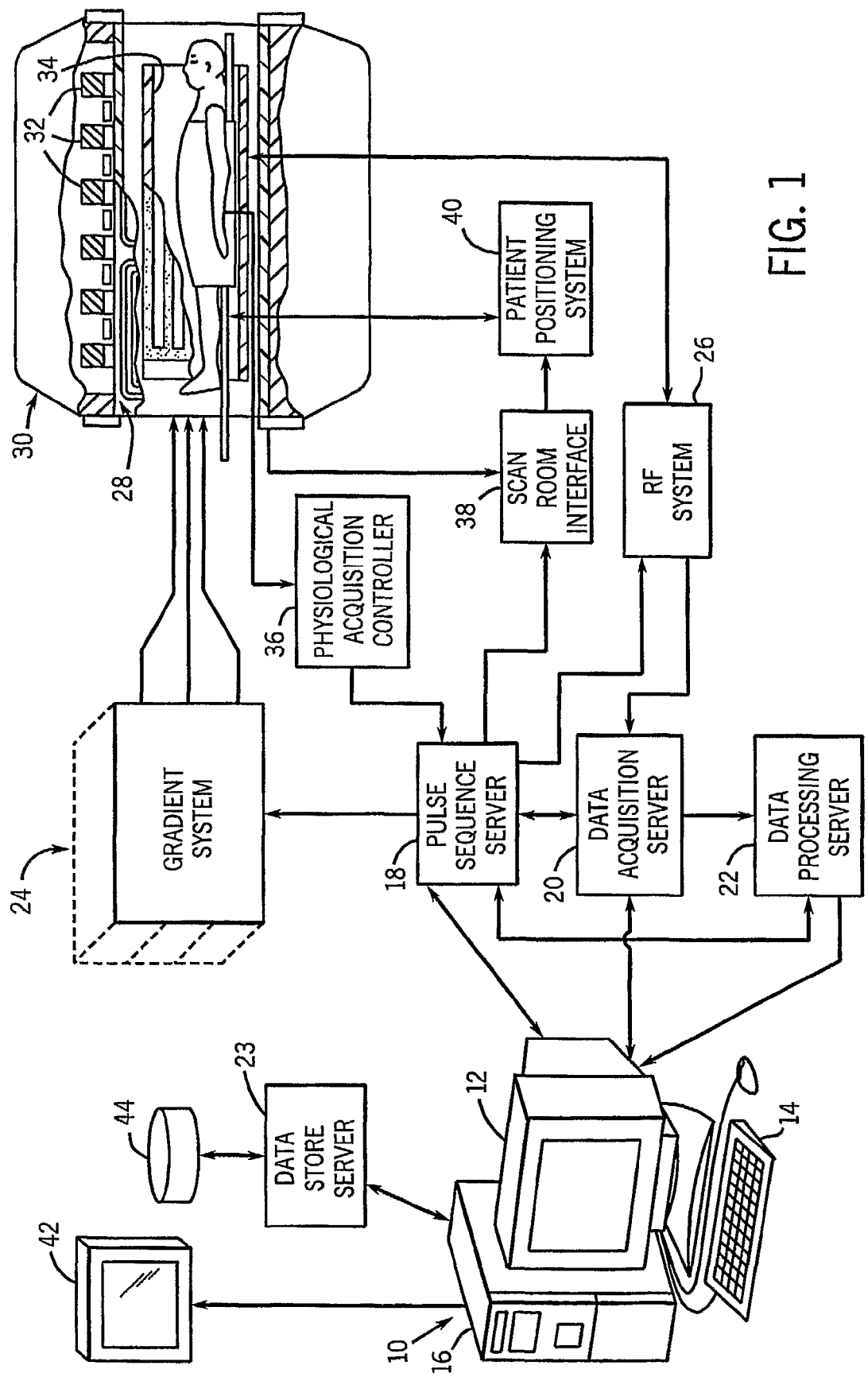
FIG. 1 is a block diagram of an MRI system which employs the present invention.

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The remaining three servers 18, 20 and 22 are performed by separate processors mounted in a single enclosure and interconnected using a 64-bit backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors based on commercially available parallel vector processors.

The workstation 10 and each processor for the servers 18, 20 and 22 are connected to a serial communications network. This serial network conveys data that is downloaded to the servers 18, 20 and 22 from the workstation 10 and it conveys tag data that is communicated between the servers and between the workstation and the servers. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$, and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels and in the preferred embodiment four receiver channels are employed. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2},$$

and the phase of the received NMR signal may also be determined:

$$\phi=\tan^{-1}Q/I.$$

A four-element phased array leg coil is employed to acquire 2D SENSE data. It is a 4-element array with each coil element measuring 40 cm by 15 cm. One pair is placed anterior to the subject's legs and the other pair is placed posterior to the legs. Other leg coils have also been employed which have eight coil elements and it is contemplated that 16 or even 32 element arrays will be used in future embodiments.

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with description components downloaded from the workstation 10. Such processing may include, for example: Fourier transformation of raw k-space NMR data to produce two or three-dimensional images; the application of filters to a reconstructed image; the performance of a back projection image reconstruction of acquired NMR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
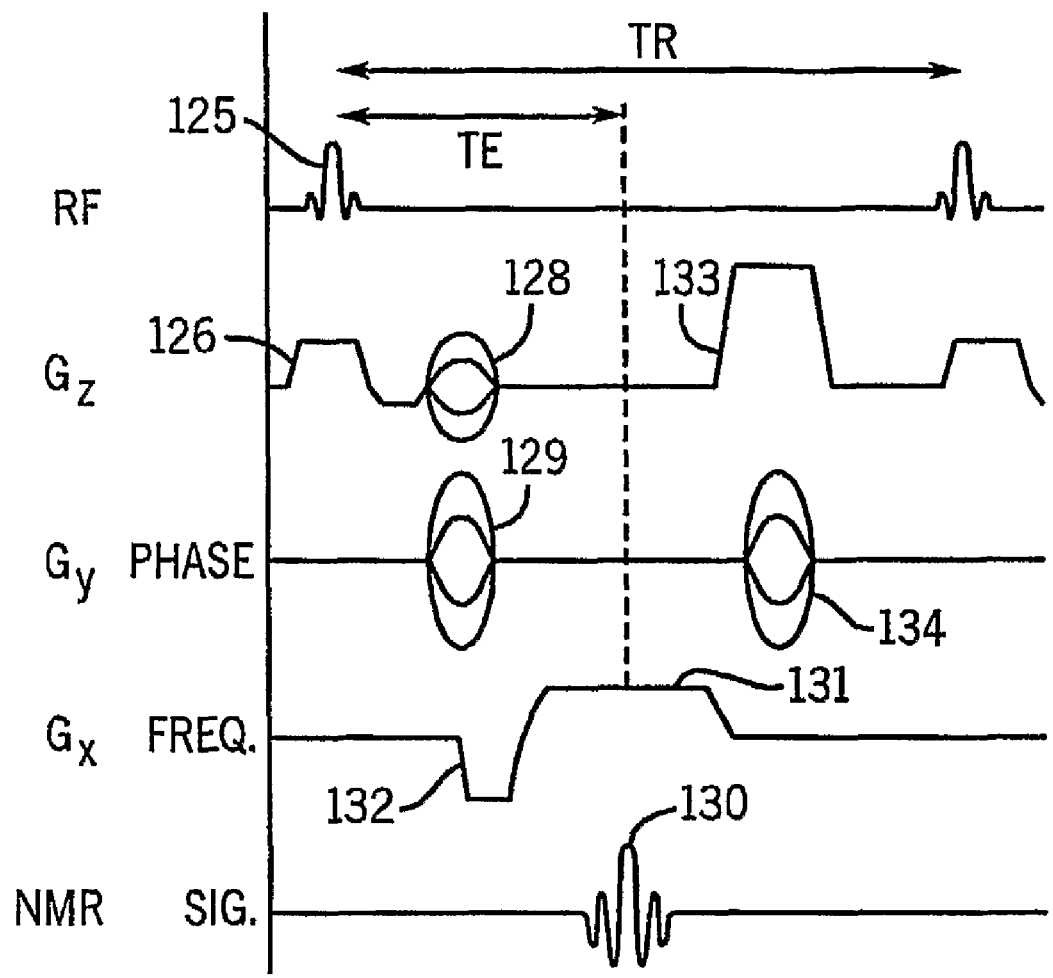
FIG. 2 is a graphic representation of a preferred pulse sequence used to direct the MRI system of FIG. 1.

The NMR system of FIG. 1 performs a series of pulse sequences to collect sufficient NMR data to reconstruct an image. Referring particularly to FIG. 2, an exemplary pulse sequence for conducting a 3 DFT NMR scan is shown. The pulse sequence commences by the selective excitation of the entire region of interest with an RF excitation pulse 125 in the presence of a slab select $G_z$ gradient pulse 126. The frequency content of the excitation pulse 125 and the amplitude of the slab select $G_z$ pulse 126 are selected to produce transverse magnetization in the region which is the subject of the 3D scan. A negative $G_z$ pulse 127 is then produced to rephase the spins in preparation for the phase encoding and readout.

Phase encoding is performed along two axes: the z-axis and the y-axis. The z-axis encoding is accomplished by applying a $G_z$ phase encoding pulse 128 and the y-axis encoding is accomplished by applying a $G_y$ phase encoding pulse 129. As is well-known to those skilled in the art, the magnitude of the phase encoding pulses 128 and 129 are stepped through a series of positive and negative values during the scan, but each is set to one value during each pulse sequence. As will be described in detail below, the order in which these phase encoding pulses 128 and 129 are stepped through their set of values will depend on the particular clinical application of the invention. As is well-known in the art, the magnitude of a phase encoding gradient pulse is determined by the integral of its amplitude over its duration (i.e. its area). In most pulse sequences the duration is kept constant and the phase encoding pulse magnitude is stepped through its values by changing its amplitude.

After phase encoding the transverse magnetization, the NMR signal 130 is read-out in the presence of a $G_x$ read-out gradient 131. This read-out is preceded by a negative $G_x$ gradient pulse 132 to produce the gradient refocused NMR echo signal 130 in the usual fashion. The 3DFT pulse sequence is then concluded by the application of a large $G_z$ spoiler gradient pulse 133 and a $G_y$ rewinder gradient pulse 134 to prepare the magnetization for the next pulse sequence which follows immediately. As is known to those skilled in the art, the spoiler pulse 133 dephases transverse magnetization and the rewinder pulse 134 refocuses transverse magnetization along the y-axis in preparation for the next pulse sequence. The rewinder pulse 134 is equal in magnitude, but opposite in polarity with the $G_y$ phase encoding pulse 129. In the alternative, RF spoiling may be used to dephase the transverse magnetization.

The acquisition of data in 3DFT scanning can be considered sampling of a three-dimensional "k-space". Two of the dimensions, ky and kz, are sampled by applying different phase encoding gradients Gy and Gz during each pulse sequence of the scan, and each acquired NMR signal contains 256 samples along a line in the kx direction. The ky and kz phase encodings are defined as the gyromagnetic ratio times the area under the Gy and Gz gradient waveforms applied after the RF excitation pulse 125 and before the readout of echo signal 130. The pulse sequence is repeated for as many repetitions as are necessary to sample all desired ky and kz values. For example, ky may assume 128 different values and kz may have 64 values. In this case the number of repetitions of the pulse sequence of FIG. 2 would be 128×64 or 8192.

Figure 3:
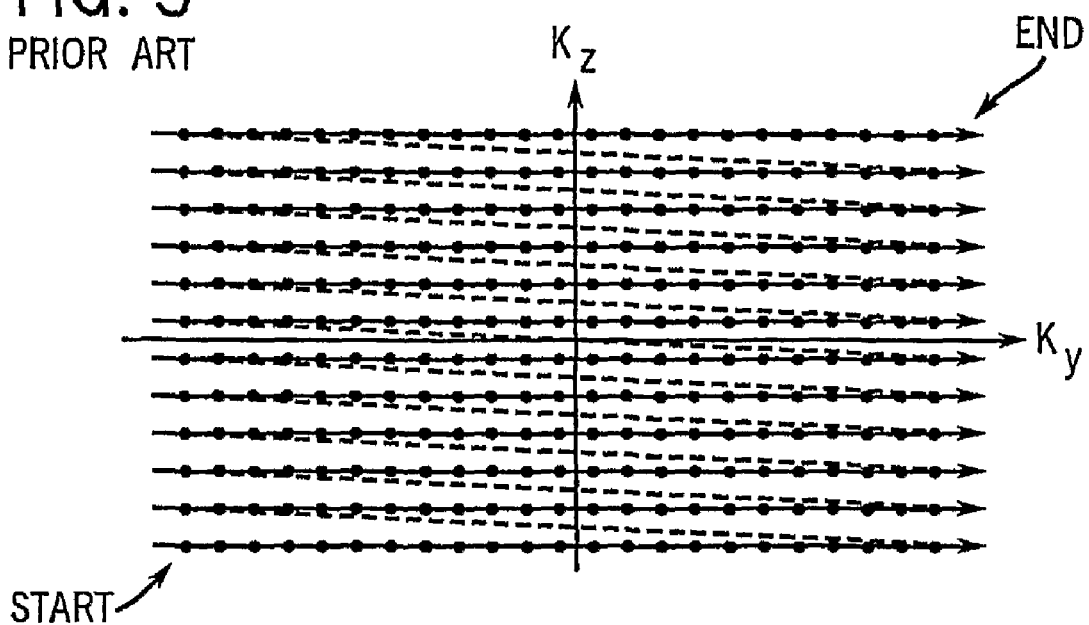
FIG. 3 is a graphic representation of a prior art Cartesian k-space sampling pattern.

With conventional 3DFT scanning the desired values of ky and kz are sampled with two nested loops. For example, the inner loop increments ky through its 128 values and after all such samples have been made for a given value of kz, the outer loop increments kz. This process continues until all 128 values of ky have been sampled at each of the 64 values of kz. A diagram of this prior process is shown in FIG. 3, where the vertical axis indicates the sample along kz produced by the magnitude of the Gz phase encoding pulse, and the horizontal axis indicates the sample along ky produced by the magnitude of the Gy phase encoding pulse. The arrow shows the temporal trajectory through (ky, kz) space of the sampling during the scan. The sampling starts in the lower left corner with negative ky and kz samples, and ends at the upper right corner with positive ky and kz samples. In this conventional scan, therefore, (ky, kz) space is scanned in much the same way as a television screen is scanned.

Figure 4:
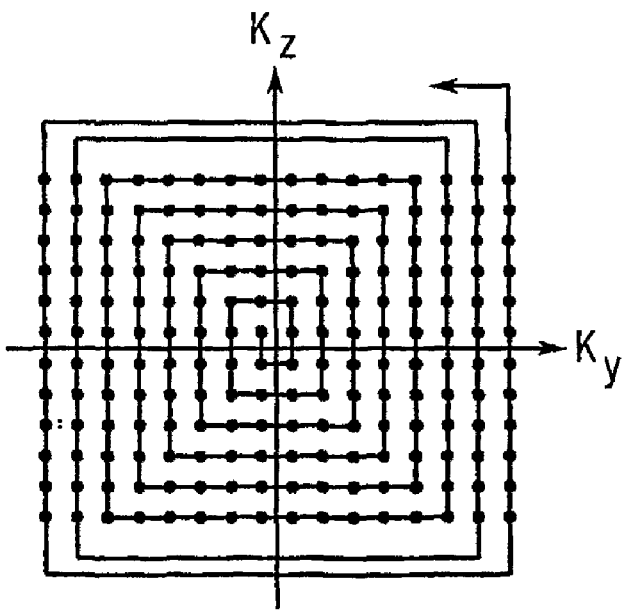
FIG. 4 is a graphic representation of a prior art centric k-space sampling pattern.

Centric view ordering is based on the realization that for most objects the bulk of the signal power is contained in the samples taken near the origin of (ky, kz) space, and it is these samples which contribute most significantly to the appearance of the reconstructed image. This results from the fact that the NMR signals acquired during the scan are Fourier transformed along the kx, ky and kz directions to produce intensity values for an image in real (x,y,z) space. It is the nature of this transformation that the samples near the origin (ky=0, kz=0) contribute a disproportionate share to the signal power of the reconstructed image. Accordingly, it is a basic idea of centric view ordering to sample the (ky, kz) points which contain the most signal power in as short a time and as close to the beginning of the scan as possible. This can be done by modifying the trajectory with which the (ky, kz) space is sampled. Specifically, a square spiral (ky, kz) trajectory, such as that shown in FIG. 4 may be used. The scan starts at or near the origin of (ky, kz) space and progressively works its way outward in a spiral fashion. In FIG. 4, a 12×16 array of k-space samples are acquired, but this is only illustrative, since in practice many more samples are usually acquired to cover the field of view with adequate resolution. The manner in which the values of the Gy and Gz phase encoding gradients may be stepped to accomplish such a spiral trajectory scan is described in U.S. Pat. No. 5,122,747.

A second, and more preferred centric view order is the so-called "elliptical centric" view order described in U.S. Pat. No. 5,912,557. This is a view order based on the distance of the sample point from the origin of k-space. First, we assume that the field of view along y is FOV and that the field of view along z is some fraction of this, FOV/N. The ky values which are to be sampled in the phase encoding process are $\pm 1/(2\,\text{FOV})$, $\pm 3/(2\,\text{FOV})$, $\pm 5/(2\,\text{FOV})$, ..., $\pm m/(2\,\text{FOV})$, where m+1 is the total number of ky phase encodes desired. This assumes that the ky origin is not sampled and the smallest nonzero ky spatial frequencies sampled are at $\pm 1/(2\,\text{FOV})$. Similarly the kz values which are to be sampled are $\pm N/(2\,\text{FOV})$, $\pm 3N/(2\,\text{FOV})$, $\pm 5N/(2\,\text{FOV})$, ..., $\pm nN/(2\,\text{FOV})$, where n+2 is the total number of kz phase encodes. All phase encodings to be sampled can then be characterized by the index (i,j), where $-m \leq i \leq m$ and $-n \leq j \leq +n$ and i and j assume nonzero integer values. The distance from the k-space origin to the sample point is characterized by the indices (ij) and is equal to $(1/\text{FOV})\,\text{sqrt}\,\{[2|i|-1]^2 + N2[2|j|-1]^2\}$ where "sqrt" denotes the operation of taking the square root and |*| denotes absolute value of *. Once the distance is determined for all k-space sample points (i,j), the points are ranked on the basis of their respective distances with the point having the smallest distance being ranked first. In this way, the ordered list of desired phase encodings, or views, is determined and stored for use during a scan in which image data is acquired.

Figure 5:
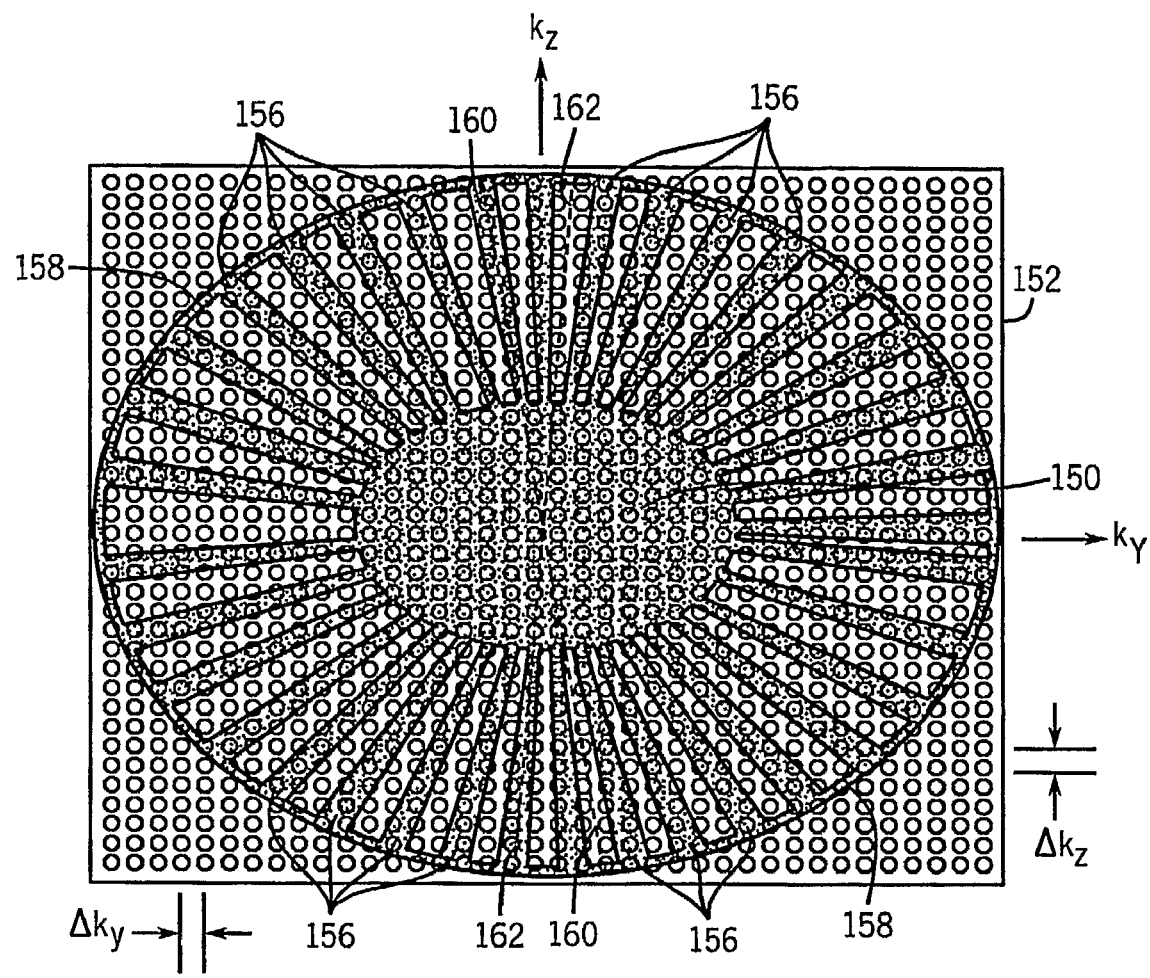
FIG. 5 is a graphic representation of a preferred k-space sampling pattern according to the present invention.

Referring particularly to FIG. 5, the present invention employs a prescribed k-space sampling pattern that employs the elliptical centric view order to sample an elliptical, central region of $k_z$-$k_y$ space as indicated at 150. The prescribed field of view and resolution of the image to be acquired dictates that that $k_z$-$k_y$ space bounded by rectangle 152 be sampled at the grid of sample points indicated by the "O's" for full k-space sampling. According to the present invention, however, this k-space is only partially sampled. Full sampling is done in the central region 150 and only partial sampling is done in peripheral $k_z$-$k_y$ space as indicated by the darkened radial sectors 156 that extend radially outward from the elliptical central region 150. The periphery of the sampled $k_z$-$k_y$ space is defined by an ellipse 158 whose dimensions are determined by $K_z\text{MAX}$ and $K_y\text{MAX}$. The central region occupies from 10% to 20% of k-space and the sampled radial sectors sample 50% of k-space within the outer boundary 158. There is no k-space sampling beyond the outer boundary 158.

Figure 7:
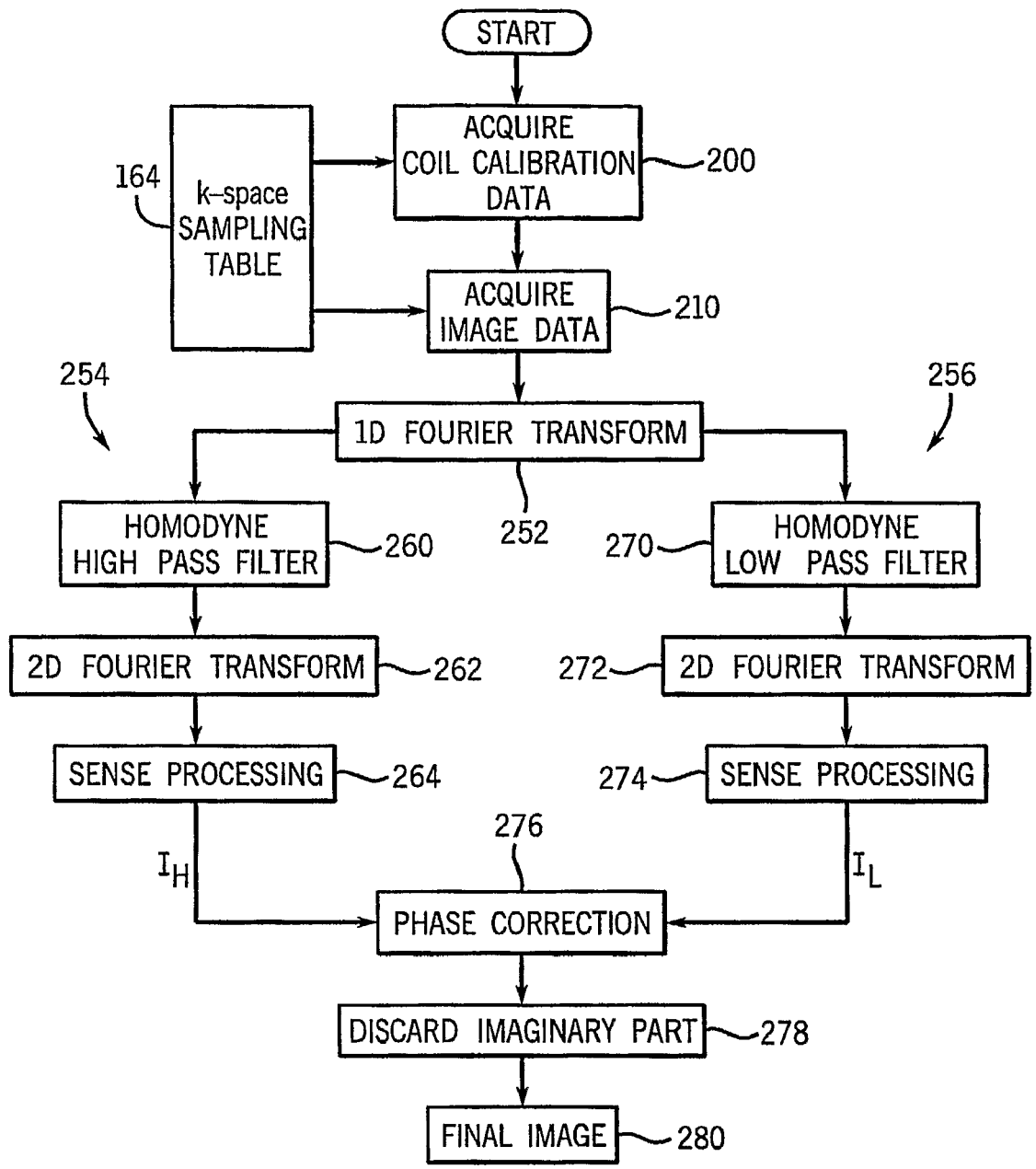
FIG. 7 is a flow chart of the steps in the preferred method for acquiring and reconstructing images using the k-space sampling pattern of FIG. 6.

The sampled radial sectors 156 are conjugates of corresponding unsampled sectors of k-space. For example, the radial sector 156 indicated by dashed line 160 samples in positive $k_z$ and negative $k_y$ space and its corresponding conjugate sector is unsampled. Similarly, the sampled sector indicated by dashed line 162 samples in negative $k_z$ and $k_y$ space and its conjugate radial sector is unsampled. The sampled radial sectors 156 are thus asymmetrical. The location and order that the central region 150 and radial sectors 156 are sampled is stored in a k-space sampling table 164 as shown in FIG. 7. While a particular sampling order is preferred for this particular clinical application, it will be apparent to those skilled in the art that other sampling orders may be preferred for other clinical applications and stored in the sampling table 164.

Figure 6:
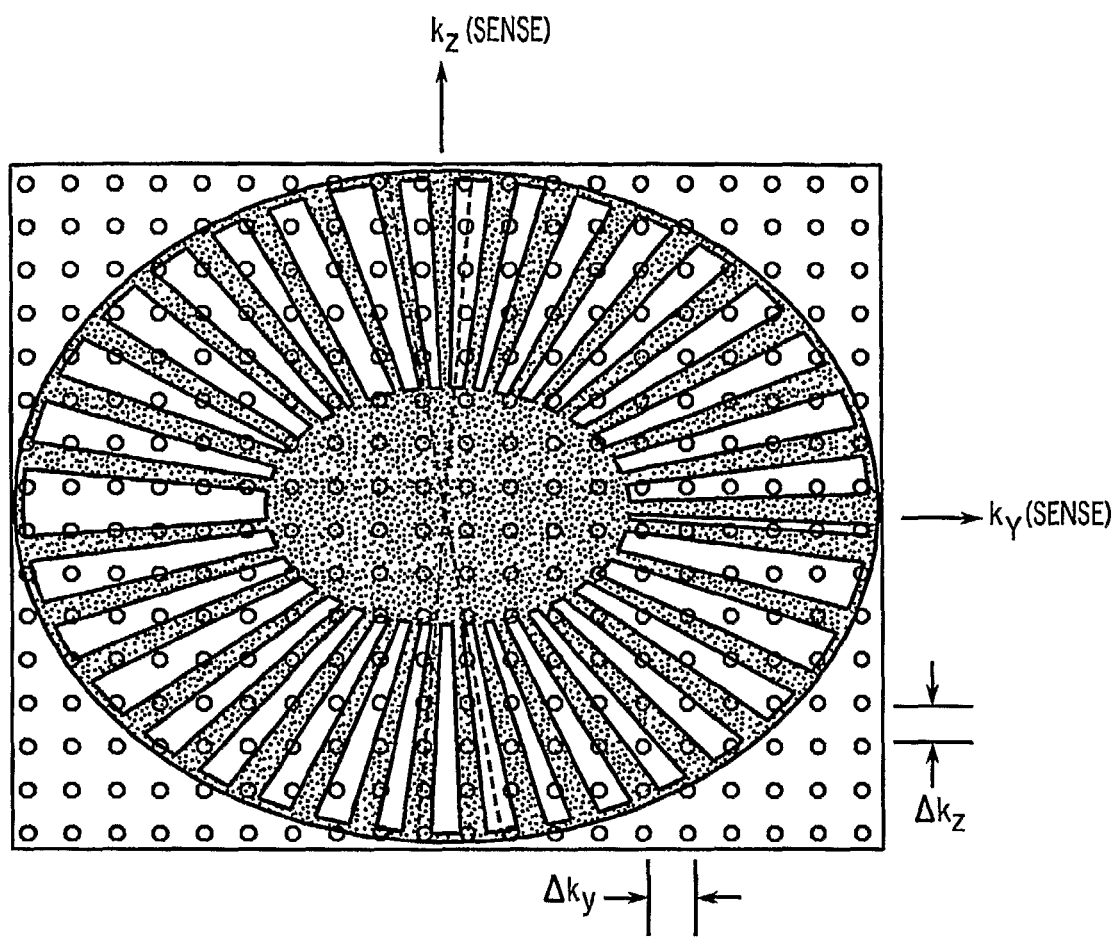
FIG. 6 is a graphic representation of the preferred k-space sampling pattern acquired using a SENSE acquisition.

In addition to the above k-space undersampling pattern, a further reduction in the number of phase encoding views along the $k_z$-$k_y$ axes is achieved using a 2D SENSE acquisition. As shown in FIG. 6, a four-fold SENSE-encoded acquisition with R=2 along each of the phase encoding axes is illustrated. This is illustrated in FIG. 6 by the two-fold increase in sampling intervals $\Delta k_y$ and $\Delta k_z$ compared to the sampling intervals in the acquisition of FIG. 5. The k-space sampling pattern is unchanged from that shown in FIG. 5, but the sampling density is reduced throughout the sampling pattern.

Modifications can be made to accommodate more sampling points if it is desired to offset some of the SNR loss experienced when these undersampling techniques are employed. The additional sample points may be used to enlarge the fully sampled central region 150, or they can be distributed to the outer k-space annulus to widen several sectors 156 and provide additional high-spatial frequency information. In the preferred embodiment 58% of the sample points are acquired during the scan.

Referring particularly to FIG. 7, an MR image is acquired using the k-space sampling table 164 that lists the views that are to be acquired. Because the method employs SENSE, the first step indicated at process block 200 is to acquire calibration data from which sensitivity profiles for each of the four separate coils can be produced. To ensure that the coil sensitivity maps accurately reflect their SENSE-aliased counterparts, the k-space that is acquired for the calibration is the same as that acquired for the images. The calibration acquisition 200, therefore, employs the k-space sampling table 164. A 3D gradient-recalled echo pulse sequence with TR/TE=15/3 ms, flip angle=10°, and a receive bandwidth=+ 31.25 kHz is used to acquire the calibration data. The sensitivity profiles of individual coils are obtained by normalization with a sum-of-squares combination and the resolution of the acquired calibration images are two-fold coarser than that of the images to be acquired.

As indicated at process block 210, the next step is to acquire the image data. The above-described pulse sequence is used and its two phase encoding gradients are stepped through values to sample the successive k-space sample points listed in the k-space sampling table 164. More specifically, the central region 150 is sampled first in an elliptical centric view order, and then the radial sectors 156 are sampled. The radial sectors 156 are also sampled in an elliptical centric view order in which the k-space sample point in the radial sectors 156 closest to the center of k-space is sampled first.

While a single image may be acquired, typically the present invention is used when multiple images are to be acquired at a high temporal resolution. For example, the method may be employed in a moving table MRA examination of the lower extremities where a high image acquisition rate is needed to follow the contrast bolus down through the legs. Or, it may be used in a dynamic CEMRA study where a high image acquisition rate is needed to see the inflow of contrast agent into vasculature of interest. The image acquisition step 210 will vary, therefore, depending on the particular clinical objective, but in all cases the image data is acquired with the 2D SENSE coils according to the sampling order stored in the k-space sampling table 164. Four k-space image data sets are thus acquired for each image acquisition, one for each coil element. If coil arrays having more elements are used, such as 8, 16 or 32, then a corresponding number of k-space image data sets are acquired.

Each set of four k-space data sets is processed as will now be described to produce a single reconstructed 3D image. If multiple images are acquired during step 210, then this reconstruction process is repeated for each corresponding set of four k-space image data sets. Further processing may also be performed after image reconstruction, such as subtraction of a mask image from one or more contrast enhanced images.

Referring still to FIG. 7, the first step in the image reconstruction process is to perform a one-dimensional Fourier transformation of the four acquired 3D k-space image data sets along the readout axis (x-axis in the preferred embodiment) as indicated at process block 252. One copy of each Fourier transformed data set is processed in a series of steps indicated at branch 254 and a second copy of each is processed in a series of steps indicated at branch 256. These two separate processes are required by the homodyne reconstruction method. In branch 254 the missing k-space data in the peripheral k-space region is produced, and in the branch 256 phase data is produced which is required to correct errors in the missing data produced in branch 254.

The first step in branch 254 is to high pass filter the four data sets as indicated at process block 260. More specifically, this includes filling in the unsampled k-space peripheral locations with the samples acquired at their complex conjugate locations, and then doubling the amplitude of all samples outside the elliptical central region 150. A two-dimensional, complex Fourier transformation is then performed on this complete data set as indicated at process block 262. This 2DFT is performed along the two phase encoding axes (y and z in the preferred embodiment). The result is four complete 3D image data sets which contain phase errors caused by the homodyne high pass filter process 260.

As indicated by process block 264, the next step is to employ the SENSE process to calculate a single image using the four filled images reconstructed above. The SENSE unfolding is well known to those skilled in the art and the method employed in the preferred embodiment is described in Pruessmann K P, Weiger M, Scheidegger M B, Boesiger P. "SENSE: Sensitivity Encoding For Fast MRI," Magn. Reson. Med. 1999; 42:952-962. As a result of the SENSE processing 264, a single high pass image $I_H$ is produced in which aliasing artifacts along the two phase encoding axes have been removed. However, as discussed above, this image $I_H$ contains phase errors due to the homodyne filter.

Referring still to FIG. 7, the removal of the phase errors is accomplished with phase corrections calculated in branch 256. The first step as indicated at process block 270 is to low pass filter the second copy of the four acquired and once Fourier transformed data sets. This filtering is done very simply by setting all points outside the fully-sampled central region 150 to zero. The homodyne low pass filter thus removes all the asymmetrically acquired peripheral k-space samples.

The low pass filtered data in each data set is then Fourier transformed in the two phase encoding directions as indicated at process block 272 to produce four low pass filtered images. The four low pass filtered images are SENSE processed as indicated at process block 274. The SENSE process 274 is identical to the SENSE process 264 described above and a single low pass image $I_L$ is produced. This image $I_L$ contains the phase information needed to correct the high pass image $I_H$.

The phase correction is made to the high pass image $I_H$ at process block 276. This is accomplished by subtracting the phase at each pixel in the low pass filtered image $I_L$ from the phase of the corresponding pixel in the high pass image $I_H$. The resulting complex image includes a real and an imaginary component at each pixel location, and the imaginary components are discarded at process block 278. The result is a final image 280 comprised of the real components.

As indicated above, this reconstruction process may be repeated to reconstruct other images acquired during the same scan with the same coil array placement.

The invention claimed is:

1. A method for producing an image with a magnetic resonance imaging (MRI) system, the steps comprising:
   a) directing the MRI system to acquire NMR signals by sampling three-dimensional k-space at a plurality of points arranged on a grid of sample points, wherein all of the plurality of points on the grid of sample points within a central region of the three-dimensional k-space are all sampled and only selective ones of the plurality of points on the grid of samples points outside the central region and within a peripheral region of k-space are sampled as a set of radial sectors that are asymmetrical about an origin of a plane in k-space and outside the central region and do not extend into the central region;
   b) acquiring the NMR signals with a plurality of separate coils and receive channels to produce corresponding separate k-space image data sets;
   c) performing a homodyne high pass filtering operation on each of the k-space image data sets;
   d) reconstructing an image from each of the high pass filtered k-space image data sets;
   e) producing a high pass image ($I_H$) by combining the images produced in step d);
   f) performing a low pass filtering operation on each of the k-space image data sets;
   g) reconstructing another image from each of the low pass filtered k-space image data sets;
   h) producing a low pass image ($I_L$) by combining the images produced in step g); and
   i) producing an image by correcting the phase of the high pass image ($I_H$).

2. The method as recited in claim 1 in which steps e) and h) employ SENSE processing.

3. The method as recited in claim 1 in which step c) includes filling in unsampled radial sectors with sampled complex conjugate k-space data.

4. The method as recited in claim 1 in which step f) includes setting k-space samples to zero throughout the peripheral region of k-space.

5. The method as recited in claim 1 in which steps d) and g) include performing a two-dimensional Fourier transformation on each k-space image data set.

6. The method as recited in claim 1 which includes: performing a one-dimensional Fourier transformation on the separate k-space image data sets acquired in step b).

7. The method as recited in claim 1 in which step a) includes performing a three-dimensional pulse sequence having a readout gradient and two phase encoding gradients and the sampling pattern is achieved by stepping the two phase encoding gradients through a series of values stored in a table.

8. The method as recited in claim 7 which includes stepping the two phase encoding gradients through a series of values that sample the central region in a centric view order.

9. The method as recited in claim 8 in which the centric view order is an elliptical centric view order.

10. The method as recited in claim 9 in which the radial sectors are also sampled in an elliptical centric view order.

11. The method as recited in claim 1 in which the plane in k-space correspond to samplings acquired by applying different phase encoding gradients during each pulse sequence of the scan.

12. The method as recited in claim 1 in which sampling the peripheral k space as the set of radial sectors that are asymmetrical about the origin of the plane in k-space of step a) is performed by repeating a pulse sequence in which two dimensions are sampled by applying different phase encoding gradients and a third dimension is sampled along a line of samples acquired during each repetition of the pulse sequence.

13. The method as recited in claim 12 in which acquiring the NMR signals of step b) is performed with a reduced number of phase encoding gradients with respect to step a).

* * * * *

UNITED STATES PATENT AND TRADEMARK OFFICE
CERTIFICATE OF CORRECTION

| | |
|---|---|
| PATENT NO. | : 8,320,646 B2 |
| APPLICATION NO. | : 11/913429 |
| DATED | : November 27, 2012 |
| INVENTOR(S) | : Hu et al. |

It is certified that error appears in the above-identified patent and that said Letters Patent is hereby corrected as shown below:

Column 1, line 2, "Fourier Pace Sampling" should be -- Fourier Space Sampling --

Column 1, line 28, "but process about" should be -- but precess about --

Signed and Sealed this
Fifth Day of March, 2013

Teresa Stanek Rea
*Acting Director of the United States Patent and Trademark Office*